(12) United States Patent
Konishi et al.

(10) Patent No.: US 9,184,326 B2
(45) Date of Patent: Nov. 10, 2015

(54) SOLAR CELL MODULE

(75) Inventors: Yasufumi Konishi, Osaka (JP); Masayuki Kusumoto, Osaka (JP); Tomotsugu Yuhi, Osaka (JP)

(73) Assignee: ONAMBA CO., LTD. (JP)

( * ) Notice: Subject to any disclaimer, the term of this patent is extended or adjusted under 35 U.S.C. 154(b) by 169 days.

(21) Appl. No.: 13/503,619

(22) PCT Filed: Nov. 27, 2009

(86) PCT No.: PCT/JP2009/006419
§ 371 (c)(1),
(2), (4) Date: Apr. 23, 2012

(87) PCT Pub. No.: WO2011/064820
PCT Pub. Date: Jun. 3, 2011

(65) Prior Publication Data
US 2012/0216856 A1    Aug. 30, 2012

(51) Int. Cl.
*H02N 6/00*    (2006.01)
*H01L 31/042*  (2014.01)
*H01L 31/048*  (2014.01)
*H02S 40/34*   (2014.01)

(52) U.S. Cl.
CPC ............ *H01L 31/0488* (2013.01); *H02S 40/34* (2014.12); *Y02E 10/50* (2013.01)

(58) Field of Classification Search
CPC . H01L 31/0485; H01L 31/0488; H01L 31/05; H02S 40/00; H02S 40/34; H02S 40/345; H02S 40/36
USPC ......................................................... 136/251
See application file for complete search history.

(56) References Cited

U.S. PATENT DOCUMENTS

| 5,280,133 | A  | * | 1/1994 | Nath ............................. 174/373 |
| 6,066,796 | A  | * | 5/2000 | Itoyama et al. ............... 136/251 |
| 2005/0000562 | A1 | * | 1/2005 | Kataoka et al. ............... 136/251 |

(Continued)

FOREIGN PATENT DOCUMENTS

| JP | 11-354822   | 12/1999 |
| JP | 2000-299485 | 10/2000 |

(Continued)

OTHER PUBLICATIONS

International Bureau of WIPO, "International Preliminary Report on Patentability", Jul. 19, 2012, 5 pgs.

(Continued)

*Primary Examiner* — Eli Mekhlin
(74) *Attorney, Agent, or Firm* — Kolisch Hartwell, P.C.

(57) ABSTRACT

A solar cell module, having a solar cell panel including a front-surface light-transmitting member, a rear-surface light-transmitting member, and a solar cell arranged between these members, and a terminal box for taking out an electric current from the solar cell panel, and further having a bus bar laid to transmit an electric current generated from the solar cell inside the solar cell panel through an end of the solar cell panel to a terminal plate inside the terminal box, wherein the terminal box is fitted to the panel in a manner so as to cover the end of the solar cell panel, through which the bus bar is passed, and further cover a light-receiving surface side region of the front-surface light-transmitting member, and a light-receiving surface side region of the rear-surface light-transmitting member, these regions being adjacent to the end.

5 Claims, 4 Drawing Sheets

(56) References Cited

U.S. PATENT DOCUMENTS

| | | | |
|---|---|---|---|
| 2007/0056625 A1* | 3/2007 | Higuchi et al. | 136/244 |
| 2008/0156365 A1* | 7/2008 | Scholz et al. | 136/251 |
| 2009/0114261 A1* | 5/2009 | Stancel et al. | 136/244 |

FOREIGN PATENT DOCUMENTS

| | | |
|---|---|---|
| JP | 2003-158285 | 5/2003 |
| JP | 2006-286838 | 10/2006 |
| JP | 2006-351958 | 12/2006 |

OTHER PUBLICATIONS

Japanese Patent Office, "International Search Report", Sep. 28, 2010, 9 pages.

* cited by examiner

*PRIOR ART*

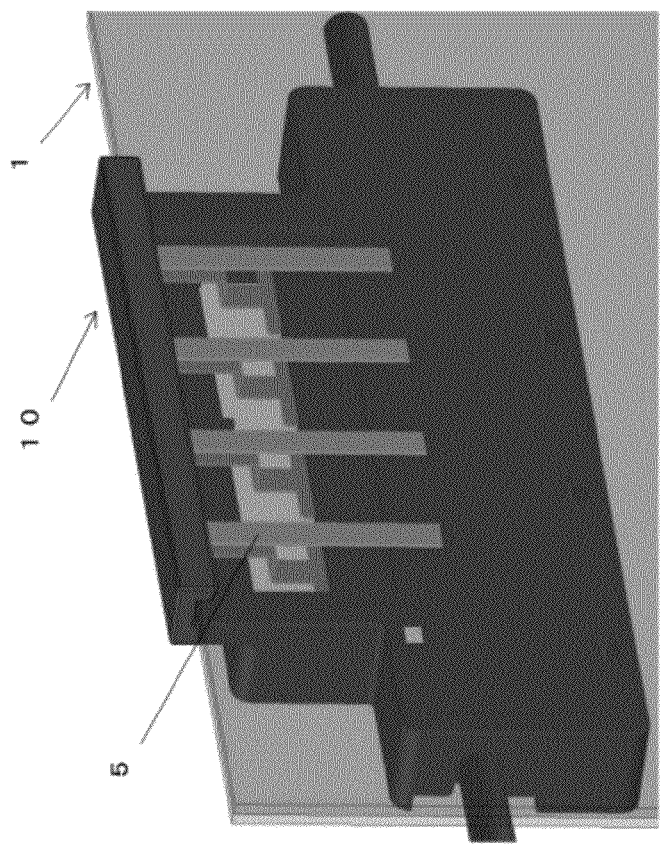
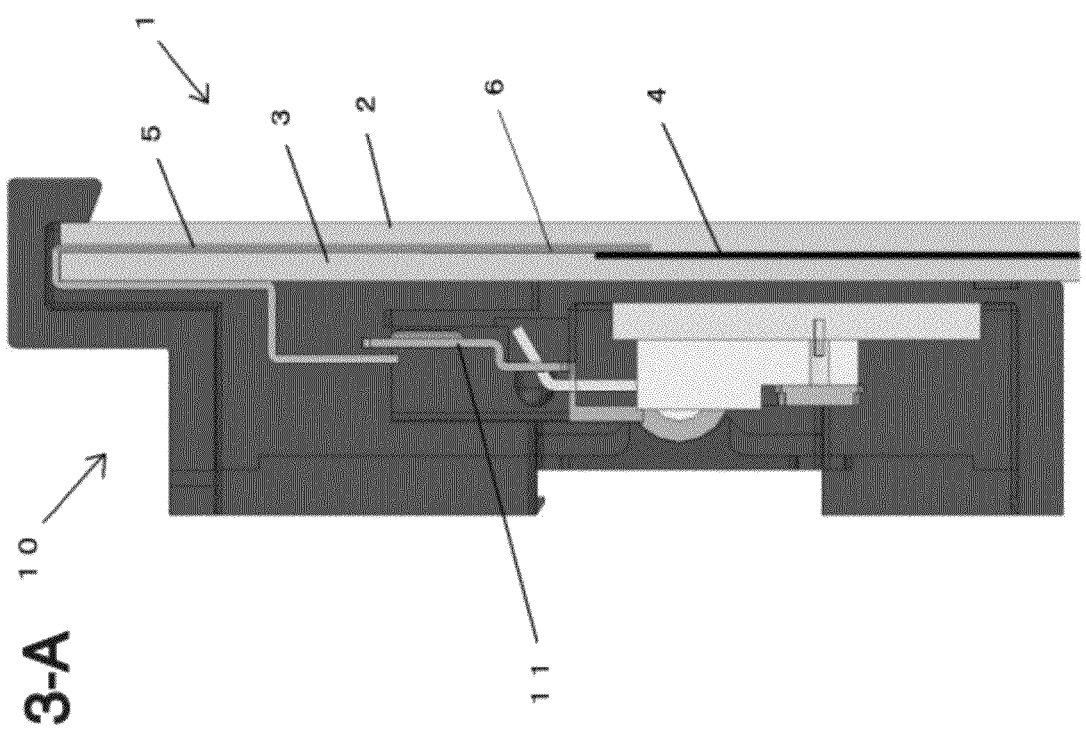

SOLAR CELL MODULE

TECHNICAL FIELD OF THE INVENTION

The present invention relates to a solar cell module in which a terminal box is fitted to a solar cell panel while the waterproofness thereof is certainly kept, the panel being a panel having both surfaces each made of a light-transmitting member and having a bus bar led out from between the light-transmitting members.

BACKGROUND ART

Solar cell panels are arranged on the roof of a sunny building, or some other in the state of being connected in large numbers to each other in order to increase the electric power generated therefrom. About each of the solar cell panels, a terminal box is fitted to the rear surface thereof. The terminal boxes of any adjacent two of the solar cell panels are electrically connected to each other through an external connection cable.

A conventional solar cell panel generally has a structure wherein a solar cell is sealed up between a light-transmitting front-surface member and a non-light-transmitting rear-surface member with a bonding sealing agent or some other. An electric current generated from the solar cell is transmitted to both poles of a terminal plate of the terminal box, which is set on the rear surface, through a bus bar led out, into a perpendicular direction, from a hole made at a substantially central position of the rear-surface member (See Patent Document 1).

In recent years, suggestions have been made about solar cell panels which have a front-surface member and a rear-surface member each made of a light-transmitting material. In order to make good use of, for example, a space on the rooftop of a building, the solar cell panels are set perpendicularly to the periphery of the rooftop, thereby functioning also as a fence (separator). In this way, the panels are harmonized with the scenery. About the solar cell panels, both of their front surface and their rear surface can receive light from early morning to evening. Thus, the panels are suitable for a case where electric power generation having a flat property is desired to be obtained. FIG. 1 illustrates a schematic sectional view of the structure of any one of the solar cell panels. In FIG. 1, reference number 1 represents a solar cell panel; 2, a front-surface member which constitutes the front surface side of the solar cell panel 1; and 3, a rear-surface member which constitutes the rear surface side thereof. These members are each made of a light-transmitting material, such as glass or a plastic material. Reference number 4 represents solar cells which each have, for example, a structure wherein a large number of solar cells made of silicon crystal, which are known in the prior art, are arranged in a matrix form; and 5, a bus bar for connecting the solar cells electrically to each other and transmitting an electric current generated from each of the solar cells 4 to both poles of a terminal plate inside its terminal box. The bus bar 5 is led out from between the light-transmitting members at an end of the solar cell panel 1 without making any hole in the rear-surface light-transmitting member. Reference number 6 represents an electrically-insulating bonding sheet for sealing up the solar cells 4 between the front-surface member 2 and the rear-surface member 3.

Conventionally, in order to fit a terminal box to such a solar cell panel, both surfaces of which are each made of a light-transmitting member, the following is adopted as illustrated in FIG. 2: a bus bar is led out from between the light-transmitting members at an end of the solar cell panel 1; subsequently, the bus bar is extended to a predetermined position of the rear surface while the bus bar is laid onto the rear-surface light-transmitting member in naked or exposed state; and then the terminal box is fitted to the panel. Since the bus bar is not wholly covered with the terminal box, the bus bar exposed to the outside is covered with an electrically-insulating sealing agent to ensure the waterproofness of the bus bar.

However, a solar cell module composed of solar cell panels and terminal boxes is exposed to an outdoor environment that undergoes heavy changes over long years. Thus, the above-mentioned conventional terminal-box-fitting method has problems that the bus bar is made naked by the secular changes, water invades the terminal boxes from bus bar-intakes in the terminal boxes, and the terminal boxes drop off from the solar cell panel.

PRIOR ART DOCUMENTS

Patent Documents

Patent Document 1: Japanese Patent Application Laid-Open (JP-A) No. 2000-299485

DISCLOSURE OF THE INVENTION

Problem that the Invention is to Solve

In order to solve the problems in the prior art, the present invention has been derived. An object thereof is to provide a solar cell module about which a terminal box can be fitted safely to a solar cell panel over a long term while the waterproofness is certainly kept, the panel being a panel having both surfaces each made of a light-transmitting member and having a bus bar led out from between the light-transmitting members.

Means for Solving the Problem

The inventors have made eager investigations to attain this object. As a result, the inventors have found out that a terminal box is hooked on an end of a solar cell panel from which a bus bar is led out, and on respective light-receiving surface side regions of a front-surface light-transmitting member and a rear-surface light-transmitting member, these side regions being adjacent to the end, so that the terminal box is fitted thereto in such a manner that the terminal box covers the end and the side regions, thereby making it possible to form a structure wherein the terminal box is unlikely to drop off from the panel while the waterproofness of the panel is certainly kept. Thus, the present invention has been made.

Accordingly, the present invention is structured as described in the following items (1) to (5):

(1) A solar cell module, having a solar cell panel including a front-surface light-transmitting member, a rear-surface light-transmitting member, and a solar cell arranged between these members, and a terminal box for taking out an electric current from the solar cell panel, and further having a bus bar laid to transmit an electric current generated from the solar cell inside the solar cell panel through an end of the solar cell panel to a terminal plate inside the terminal box, wherein: the terminal box is fitted to the panel in a manner so as to cover the end of the solar cell panel, through which the bus bar is passed, and further cover a light-receiving surface side region of the front-surface light-transmitting member, and a light-receiving surface side region of the rear-surface light-transmitting member, these regions being adjacent to the end; and the bus bar is passed through the end of the solar cell panel to be extended outward, and is then extended along the light-receiving surface of the rear-surface light-transmitting member to the light-receiving surface side of the rear-surface light-transmitting member.

(2) The solar cell module according to item (1), wherein at the end of the solar cell panel, through which the bus bar is passed, the light-receiving surface side area of the front-surface light-transmitting member is larger than the light-receiving surface side area of the rear-surface light-transmitting member, so that a step is made between the front-surface light-transmitting member and the rear-surface light-transmitting member.

(3) The solar cell module according to item (1), wherein the bus bar is passed through the end of the solar cell panel to be extended outward, and is then extended along an end of the rear-surface light-transmitting member followed by the light-receiving surface of the rear-surface light-transmitting member to the light-receiving surface side of the rear-surface light-transmitting member.

(4) The solar cell module according to item (1), wherein the terminal plate inside the terminal box is set in substantially parallel to the light-receiving surface of the rear-surface light-transmitting member.

(5) The solar cell module according to any one of items (1) to (4), wherein the terminal box includes a box body composed of at least two components including a component that covers the end of the solar cell panel, and further covers the light-receiving surface side region of the front-surface light-transmitting member and the light-receiving surface side region of the rear-surface light-transmitting member, the regions being adjacent to the end, and a component that is continuous to said component, and covers another light-receiving surface side region of the rear-surface light-transmitting member.

Advantages of the Invention

In the solar cell module of the present invention, the terminal box is fitted to the panel to cover the end of the solar cell panel, from which the bus bar is led out, and the respective light-receiving surface side regions of both the surfaces, these side regions being adjacent to the end. Therefore, the module is very high in waterproofness, and further the terminal box is unlikely to drop off from the solar cell panel. Thus, the solar cell module is high in reliability for being used over a long term.

BRIEF DESCRIPTION OF THE DRAWINGS

FIG. 3-A is a schematic sectional view illustrating a method of the present invention for fitting a terminal box to a solar cell panel.

FIG. 3-B is a schematic perspective view obtained by seeing through the solar cell module in FIG. 3A.

BEST MODE FOR CARRYING OUT THE INVENTION

Figure 2:
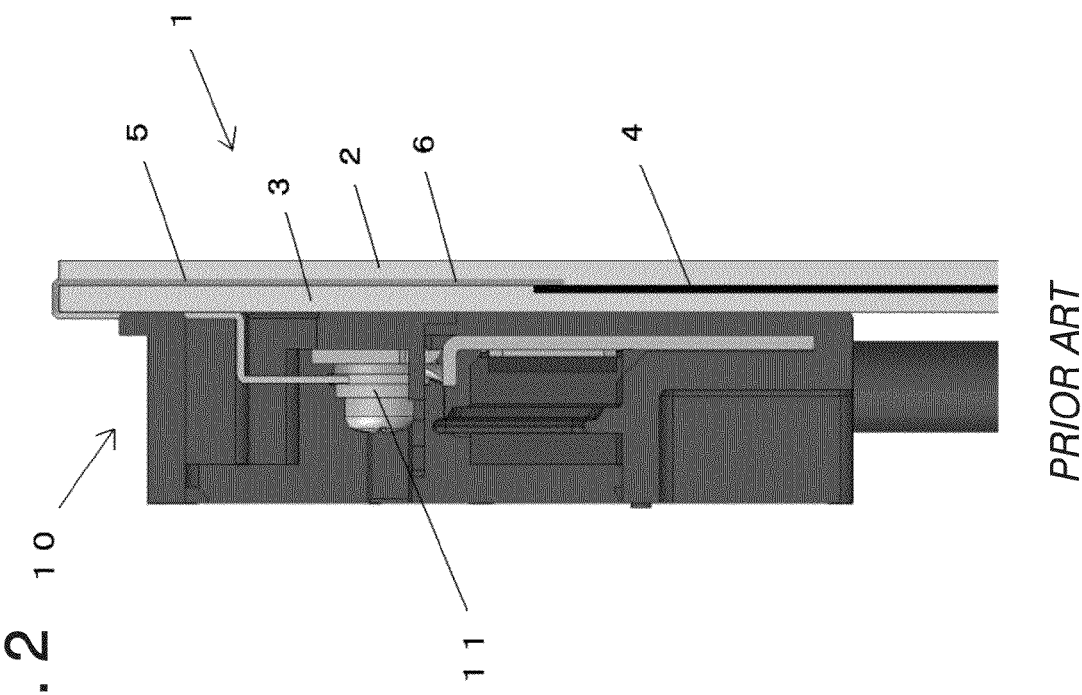
FIG. 2 is a schematic sectional view illustrating a conventional method for fitting a terminal box to a solar cell panel.
Figure 1:
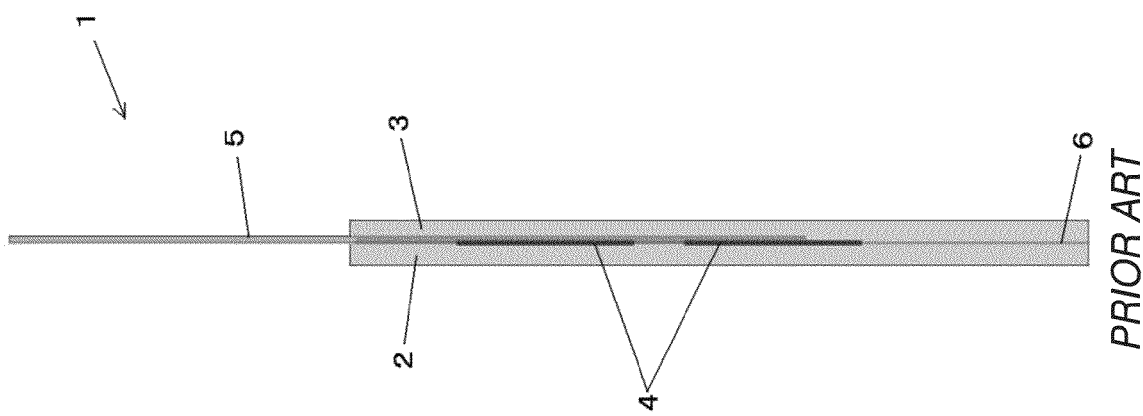
FIG. 1 is a schematic sectional view of the structure of a solar cell panel having both surfaces each made of a light-transmitting member.

The solar cell module of the present invention will be described with reference to the drawings. However, the present invention is not limited thereto.

FIG. 3 illustrates schematic views of a preferred embodiment of the solar cell module of the present invention. FIG. 3-A is a schematic sectional view of an enlarged solar cell module region to which a terminal box is fitted, and FIG. 3-B is a see-through, perspective view thereof.

In FIG. 3-A, reference number 1 represents a solar cell panel; 2, a front-surface light-transmitting member which constitutes the front surface side of the solar cell panel 1; and 3, a rear-surface light-transmitting member which constitutes the rear surface side thereof. These members are each made of a light-transmitting material known in the prior art, such as glass or a plastic material. Reference number 4 represents a solar cell wherein a large number of solar cells each made of a material known in the prior art are arranged in a matrix form; and 5, a bus bar for connecting the solar cells electrically to each other and transmitting an electric current generated from the solar cell 4 to both poles of a terminal plate inside a terminal box. The bus bar 5 is led out from between the front-surface light-transmitting member 2 and the rear-surface light-transmitting member 3 at an end of the solar cell panel 1, and then laid on the rear-surface light-transmitting member 3 to be extended to a predetermined position. The bus bar 5 is further separated from the rear-surface light-transmitting member 3 to be connected to the terminal plate 11, inside the terminal box 10. Reference number 6 represents an electrically-insulating bonding sheet for sealing up the solar cell 4 between the front-surface light-transmitting member 2 and the rear-surface light-transmitting member 3. Inside the terminal box 10, the terminal plate 11, and components such as a diode are held.

As illustrated in FIGS. 3-A and 3-B, the characteristic of the solar cell module of the present invention is that the terminal box 10 is fitted to cover the end of the solar cell panel 1, through which the bus bar 5 is passed, and cover a light-receiving surface side region of the front-surface light-transmitting member 2 and a light-receiving surface side region of the rear-surface light-transmitting member 3, the covered regions being adjacent to the end. According to this fitting manner, the terminal box 10 can be stably fitted in the state of being hooked on the end of the solar cell panel 1, and further the bus bar 5 can be completely covered, within its moiety which is extended outward from the end of the solar cell panel 1 to be connected to the terminal plate 11, with a box body of the terminal box 10. This structure makes it possible to provide a highly waterproof solar cell module having a structure wherein the terminal box does not drop off easily from the solar cell panel. It is preferred that the terminal plate 11, as well as the diode and other main components, inside the terminal box 10 are not located at the end of the solar cell panel, but located on the light-receiving surface side of the rear-surface light-transmitting member 3. This preferred structure is adopted in order that the capacity of the main components may not be restricted. The fitting of the terminal box 10 to the solar cell panel 1 can be attained by use of an electrically-insulating sealing adhesive agent in the same way as in the prior art. The terminal plate 11 and the components, such as the diode, inside the terminal box may be the same as used in the prior art. The method for connecting and fixing the bus bar 5 to the terminal plate 11 may be the same method as used in the prior art, such as soldering, welding or screwing.

Figure 4:
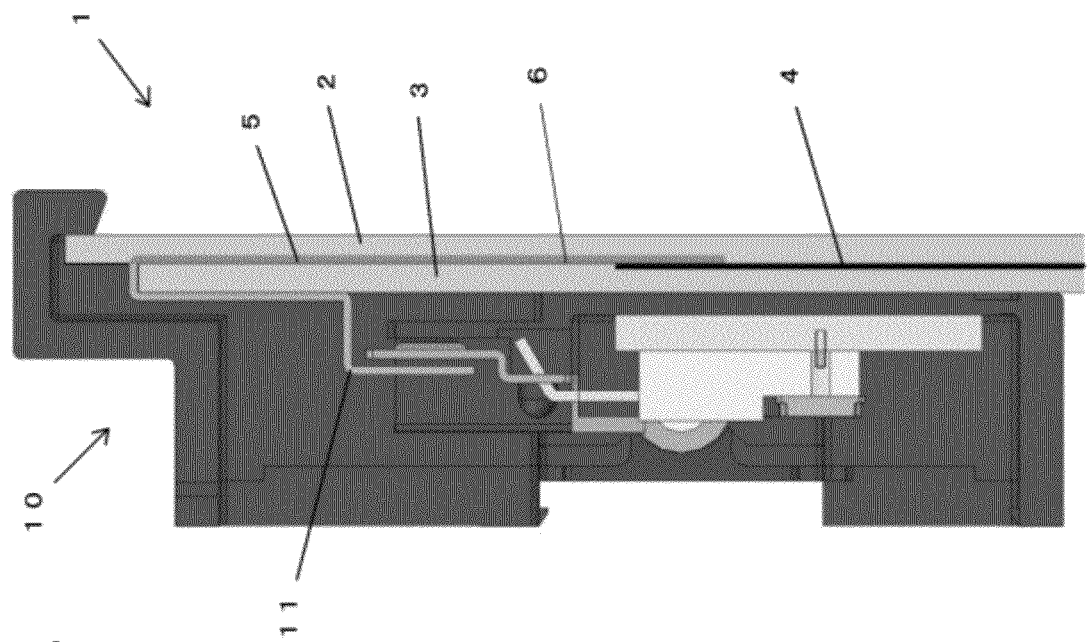
FIG. 4 is a schematic sectional view illustrating another example of the method of the present invention for fitting a terminal box to a solar cell panel.

FIG. 4 is a schematic sectional view of another preferred embodiment of the solar cell module of the present invention. The solar cell module in FIG. 4 basically has the same structure that the embodiment in FIG. 3 has. A difference between the two is that at an end of a solar cell panel 1 through which a bus bar 5 is passed, the light-receiving surface side area of a front-surface light-transmitting member 2 is larger than the light-receiving surface side area of a rear-surface light-transmitting member 3 so that a step is made between the front-surface light-transmitting member 2 and the rear-surface light-transmitting member 3. When the embodiment in FIG. 4 is compared with the embodiment in FIG. 3, corners of the solar cell panel 1 that are able to be covered with the terminal box 10 become larger in number. Thus, the present embodiment makes it possible to form a structure wherein the terminal box is more unlikely to drop off.

Figure 5:
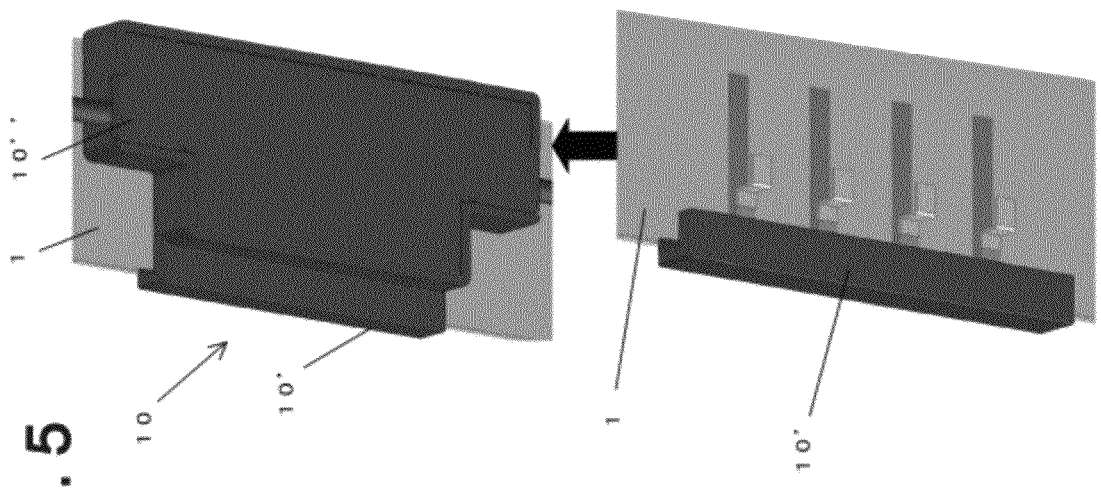
FIG. 5 is a schematic view illustrating further example of the method of the present invention for fitting a terminal box to a solar cell panel.

FIG. 5 is a schematic explanatory view of further preferred embodiment of the solar cell module of the present invention. A solar cell module in FIG. 5 basically has the same structure that the embodiment in FIG. 3 has. A difference between the two is that a terminal box 10 includes a box body composed of the following two components: a first component 10' which covers an end of a solar cell panel 1, and covers a light-receiving surface side region of a front-surface light-transmitting member 2 and a light-receiving surface side region of a rear-surface light-transmitting member 3, the covered regions being adjacent to the end; and a second component 10" which is continuous to the first component 10' to cover another light-receiving surface side region of the rear-surface light-transmitting member 3. The embodiment in FIG. 5 is useful for a case where a part of the terminal box 10 which is to be hooked on the end of the solar cell panel 1, and a part of the terminal box 10 where a terminal plate and main components, such as a diode, are to be held are desired to be composed of members different from each other. The first component 10' and the second component 10" may each be divided into plural components. It is however preferred that the first member 10' is not divided in order to make the fabrication of the module easy. It is also preferred that the terminal plate and the main components, such as the diode, are held in the second component 10", which is high in freedom degree for design.

Figure 6:
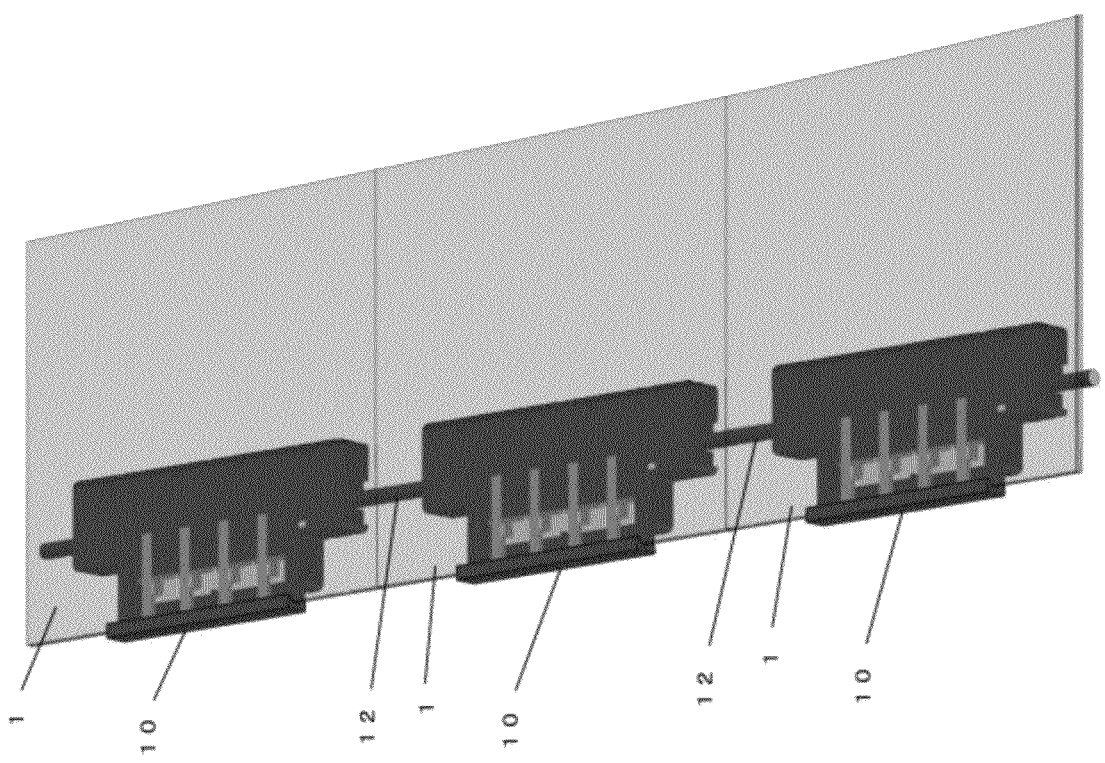
FIG. 6 is a schematic view illustrating a structure wherein solar cell modules of the present invention are connected to each other through external connection cables.

FIG. 6 is a schematic view illustrating a structure wherein plural solar cell modules 1 of the present invention are connected to each other through external connection cables 12. Each of the external connection cables 12 attains an electrical connection of terminal plates 11 to each other, the plates 11 being inside respective terminal boxes 10 of any adjacent two out of solar cell panels 1, so that the cable 12 has a function of collecting an electric current taken out from the solar cell of each of the solar cell panels 1.

INDUSTRIAL APPLICABILITY

According to the solar cell module of the present invention, the region where a bus bar is led out from a solar cell panel having both surfaces each including a light-transmitting member and is connected to a terminal plate is completely covered with a terminal box, whereby the module has a very high waterproofness. Additionally, the terminal box is hooked onto an end of the solar cell panel so as to be fitted to the panel, whereby the module has a structure wherein the terminal box is unlikely to drop off physically from the panel. As a result, the solar cell module of the present invention is high in reliability for being used over a long term. Thus, the present invention is very useful for the production of solar cells.

EXPLANATION OF REFERENCE NUMBERS

1: solar cell panel
2: front-surface light-transmitting member
3: rear-surface light-transmitting member
4: solar cell
5: bus bar
6: bonding sheet
10: terminal box
10': first component of box body of terminal box
10": second component of box body of terminal box
11: terminal plate
12: external connection cables

The invention claimed is:

1. A solar cell module, having a solar cell panel including a front-surface light-transmitting member, a rear-surface light-transmitting member, and a bifacial solar cell arranged between these members, and a terminal box for receiving an electric current from the solar cell panel, wherein a terminal plate and a diode are disposed inside the terminal box, and further having a bus bar laid to transmit an electric current generated from the solar cell inside the solar cell panel through an end of the solar cell panel to the terminal plate inside the terminal box, wherein: the terminal box is fitted to the panel in a manner so as to cover the end of the solar cell panel, through which the bus bar is passed, and further cover a light-receiving surface side region of the front-surface light-transmitting member, and a light-receiving surface side region of the rear-surface light-transmitting member, these regions being adjacent to the end; wherein the terminal plate and the diode inside the terminal box are not located on an end face of the solar cell panel, but are located on the light-receiving surface side of the rear-surface light-transmitting member adjacent the end of the solar cell panel; and wherein the bus bar extends from between the front-surface light-transmitting member and the rear-surface light-transmitting member at the end of the solar cell panel, and then extends along an outer surface of the rear-surface light-transmitting member, and
wherein the terminal box includes a box body composed of at least two components including a first component that covers the end of the solar cell panel, and further covers the light-receiving surface side region of the front-surface light-transmitting member and the light-receiving surface side region of the rear-surface light-transmitting member, the regions being adjacent to the end of the solar cell panel, and a second component that is continuous to said first component, and covers another light-receiving surface side region of the rear-surface light-transmitting member, wherein the first component covers the bus bar that extends from the end of the solar cell panel, and wherein the second component covers the terminal plate and the diode.

2. The solar cell module according to claim 1, wherein at the end of the solar cell panel, through which the bus bar is passed, the light-receiving surface side area of the front-surface light-transmitting member is larger than the light-receiving surface side area of the rear-surface light-transmitting member, so that a step is made between the front-surface light-transmitting member and the rear-surface light-transmitting member.

3. The solar cell module according to claim 1, wherein the terminal plate inside the terminal box is set in substantially parallel to the light-receiving surface of the rear-surface light-transmitting member.

4. The solar cell module according to claim 1, wherein the second component covers only the another light-receiving surface side region of the rear-surface light-transmitting member.

5. The solar cell module according to claim 1, wherein the first component covers only the bus bar that extends from the end of the solar cell panel.

* * * * *